US008535979B2

(12) United States Patent
Toda et al.

(10) Patent No.: US 8,535,979 B2
(45) Date of Patent: Sep. 17, 2013

(54) METHOD FOR MANUFACTURING SUBSTRATE FOR SEMICONDUCTOR ELEMENT

(71) Applicant: Toppan Printing Co., Ltd., Tokyo (JP)

(72) Inventors: Junko Toda, Kasukabe (JP); Susumu Maniwa, Kasukabe (JP); Takehito Tsukamoto, Tokorozawa (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 13/665,350

(22) Filed: Oct. 31, 2012

(65) Prior Publication Data

US 2013/0112652 A1 May 9, 2013

Related U.S. Application Data

(63) Continuation of application No. 13/242,099, filed on Sep. 23, 2011, now Pat. No. 8,319,322, which is a continuation of application No. PCT/JP2010/001609, filed on Mar. 8, 2010.

(30) Foreign Application Priority Data

Mar. 25, 2009 (JP) ................................. 2009-075139

(51) Int. Cl.
*H01L 21/44* (2006.01)
*H01L 21/50* (2006.01)

(52) U.S. Cl.
USPC ........... 438/107; 438/109; 438/113; 438/124; 257/676; 257/686; 257/687

(58) Field of Classification Search
USPC .......... 257/676, 686–687, 692–693, E23.037; 438/107, 109, 113, 124
See application file for complete search history.

(56) References Cited

U.S. PATENT DOCUMENTS

| 7,816,187 | B2 | 10/2010 | Huang et al. ................. 438/124 |
| 8,063,470 | B1 | 11/2011 | Sirinorakui et al. .......... 257/666 |
| 2003/0189222 | A1 | 10/2003 | Itou et al. |
| 2004/0080025 | A1* | 4/2004 | Kasahara et al. ............. 257/666 |
| 2007/0001278 | A1* | 1/2007 | Jeon et al. ...................... 257/676 |

FOREIGN PATENT DOCUMENTS

| JP | 7-273250 | 10/1995 |
| JP | 9-307043 | 11/1997 |
| JP | 2002-198482 | 7/2002 |
| JP | 3642911 | 2/2005 |

OTHER PUBLICATIONS

International Search Report for PCT/JP2010/001609 mailed Apr. 20, 2010.

(Continued)

*Primary Examiner* — Theresa T Doan

(57) ABSTRACT

A manufacturing method of a semiconductor element substrate including: forming a first photoresist pattern on a first surface of a metallic plate, to form a semiconductor element mounting part, a semiconductor element electrode connection terminal, a wiring, an outer frame part, and a slit; forming a second photoresist pattern on the second surface of the metallic plate; forming the slit by half etching to connect the metallic chip with a four corners of the outer frame part; forming a plurality of concaved parts on the second surface of the metallic plate; forming a resin layer by injecting a resin to the plurality of concaved parts; and etching the first surface of the metallic plate and forming the semiconductor element electrode connection terminal and the outer frame.

1 Claim, 5 Drawing Sheets

(56) References Cited

OTHER PUBLICATIONS

Restriction Requirement mailed from the Unites States Patent and Trademark Office on May 1, 2012 in the related U.S. Appl. No. 13/242,099.

Notice of Allowance mailed from the Unites States Patent and Trademark Office on Jul. 20, 2012 in the related U.S. Appl. No. 13/242,099.

U.S. Appl. No. 13/242,099, filed Sep. 23, 2011, Junko Toda et al., Toppan Printing Co., Ltd.

Chinese Office Action mailed Mar. 21, 2013 for corresponding Chinese Application No. 201080012985.X.

* cited by examiner

METHOD FOR MANUFACTURING SUBSTRATE FOR SEMICONDUCTOR ELEMENT

CROSS-REFERENCE TO RELATED APPLICATIONS

This application is a U.S. divisional application filed under 37 C.F.R. 1.53(b) claiming priority benefit of U.S. application Ser. No. 13/242,099, filed Sep. 23, 2011, allowed, that application being a continuation application based on and claiming priority benefit of PCT Patent Application No. PCT/JP2010/001609, filed on Mar. 8, 2010, which claims priority benefit on Japanese Patent Application No. 2009-075139, filed Mar. 25, 2009, the entire contents of which are incorporated herein by reference.

BACKGROUND

1. Field

The present invention relates to a technology involving a substrate of a semiconductor package which is suitable for mounting a semiconductor element. In particular, the present invention relates to a substrate for a semiconductor element, a method for manufacturing a substrate for a semiconductor element, and a semiconductor device.

2. Description of the Related Art

A semiconductor package using a lead frame is represented by QFP (Quad Flat Package). According to such a semiconductor package, an outer lead is placed at a side surface of the semiconductor package. The outer lead is used for making a connection with a print wiring substrate. According to this lead frame, a desired photoresist pattern is formed on both surfaces of a metallic plate. Then, an etching is performed from both surfaces. As a result, an inner lead, an outer lead, and an outer frame part are obtained. The inner lead and the outer lead are connecting parts between a semiconductor element mounting part and a semiconductor element electrode. The outer frame part fixes the inner lead and the outer lead.

In addition, other than the etching operation, the lead frame may be obtained by performing a punching operation by a press. The semiconductor package is assembled by dye-bonding a semiconductor element to a semiconductor element mounting part, and using a metallic wire to electrically connect the electrode of the semiconductor element and the inner lead. Thereafter, an area near the semiconductor element including the inner lead part is sealed by resin. Then, the outer frame part is cut. If necessary, a bending operation is performed on the outer lead.

In this way, according to an outer lead provided on a side surface, with a package size of approximately 30 mm square, a range of 200 to 300 pins is considered to be a limit from the standpoint of the capability of performing a process to achieve miniaturization.

In recent years, the number of electrodes of the semiconductor element has increased. As a result, according to a semiconductor package of a lead frame type having an outer lead at a side surface, the number of terminals has become inadequate for handling. Therefore, partially, a substitution has been made to a semiconductor package such that an external connection terminal with a print wiring substrate is positioned in an array-form at a bottom surface of the package substrate. The type of this print wiring substrate is a BGA (Ball Grid Array) type or an LGA (Land Grid Array) type. In general, a substrate used in this configuration is formed by drilling a hole on a glass epoxy substrate with a drill, plating the interior of the hole and achieving conductivity, forming a terminal on one surface to make a connection with an electrode of a semiconductor element, and by forming an external connection terminal on the other surface. Here, both surfaces of the glass epoxy substrate are clad with copper. The external connection terminal is aligned in an array form.

However, the manufacturing of these substrates is problematic because the steps are complicated, the cost becomes high. In addition, there is a decline in reliability compared to a lead frame type package, because a plating is used in the wiring connection within the substrate.

Therefore, using a step in which an etching is performed on the lead frame from both surfaces, a semiconductor package of a BGA type using a lead frame is disclosed (See, for example, Japanese Patent No. 3642911).

According to this configuration, a pattern of a photoresist at the front and back surfaces is altered, and an etching process is performed simultaneously, or, after an etching is performed on one side, an electrocoat polyimide resin layer is formed on a front surface of the etching surface, or, after a premolding resin is applied, an etching process is performed from another surface, thereby forming a connection terminal of a semiconductor element electrode at one surface, and forming an external connection terminal in an array form on the other surface.

FIGS. 11 and 12 show a conventional semiconductor element substrate. The semiconductor element substrate includes a wiring 110, an external connection terminal 111, an outer frame part 112, a polyimide resin layer 116, a semiconductor element mounting part 118, and a semiconductor element electrode connection terminal 119. As shown in FIG. 11 and FIG. 12, according to a lead frame of a BGA type, when the number of external connection terminals 111 increases, the length of the wiring 110 at a semiconductor element electrode connection terminal 119 side becomes longer. This wiring 110 is created by performing a half etching on a metallic plate. There is a problem in that the width and the thickness are both small, a folding or a bending occurs in a step after the etching, thereby causing an extreme decline in the yield.

According to Japanese Patent No. 3642911, first, a half etching is performed only on a side of the external connection terminal 111. An electrocoat polyimide resin layer is formed on the etching surface. Then, a semiconductor element electrode connection terminal 119 side is formed by etching. As a result, a fine wiring 110 is supported by a polyimide resin layer 116, although this layer is a thin film, and the folding and bending of the wiring at the time the lead frame is manufactured is prevented.

However, when a semiconductor element is mounted on the semiconductor element substrate having the present structure, and when the semiconductor element electrode and the connection terminal 119 are connected by wire bonding, the lower portion of the connection terminal 119 is hollow. As a result, there is a problem in that a force of the wiring connection is not applied, a connection defect occurs, and the assembly yield is greatly reduced.

According to Japanese Patent No. 3642911, it is presumed that the problem of the bonding defect may be prevented to a certain degree by filling in a premolding resin instead of an electrocoat polyimide resin layer. However, there is a problem in that, when a premolding resin filled into the concaved part is hardened, the resin contracts, and an adhesion force of the resin and the outer frame becomes weaker than the contracting force of the resin, thereby causing an abrasion.

An object of the present invention is to provide a semiconductor element substrate which can respond to an increase in the number of electrodes of the semiconductor element, has greater reliability, and allows a manufacturing and an assembling of the semiconductor package to be performed in a stable manner. An object of the present invention is also to provide a method of manufacturing the semiconductor element substrate. An object of the present invention is to also provide a semiconductor device.

SUMMARY

According to a first embodiment of the present invention, a manufacturing method of a semiconductor element substrate includes: a step of forming a first photoresist pattern on a first surface of a metallic plate, to form a slit penetrating the first surface of the metallic plate and a second surface different from the first surface, to connect a semiconductor element mounting part, a semiconductor element electrode connection terminal, a wiring, an outer frame part, a four corners of the outer frame part, and a metallic chip being a part of the metallic plate; a step of forming a second photoresist pattern on the second surface of the metallic plate to form an external connection terminal, the outer frame, and the slit; a step of forming the slit by half etching to connect the metallic chip with the four corners of the outer frame part; a step of forming a plurality of concaved parts on the second surface of the metallic plate; a step of forming a resin layer by injecting a resin to the plurality of concaved parts so that the resin does not enter the slit and hardening the resin; and a step of etching the first surface of the metallic plate and forming the semiconductor element electrode connection terminal and the outer frame, the semiconductor element electrode connection terminal and the outer frame being electrically connected to the semiconductor element mounting part and the external connection terminal.

According to a second embodiment of the present invention, a semiconductor element substrate includes: a metallic plate including a first surface and a second surface different from the first surface; a semiconductor element mounting part formed on the first surface of the metallic plate; a connection terminal with a semiconductor element electrode formed on the first surface of the metallic plate; a wiring formed on the first surface of the metallic plate; an outer frame part formed on the metallic plate; a connection chip connecting a four corners of the outer frame part and a metallic chip being a part of the metallic plate; an external connection terminal formed on the second surface of the metallic plate; a plurality of concaved parts formed on the second surface of the metallic plate; and a resin layer filled into the plurality of concaved parts.

According to a second embodiment of the present invention, a semiconductor device includes: a semiconductor element substrate including a metallic plate including a first surface and a second surface different from the first surface; a semiconductor element mounting part formed on the first surface of the metallic plate; a connection terminal with a semiconductor element electrode formed on the first surface of the metallic plate; a wiring formed on the first surface of the metallic plate; an outer frame part formed on the metallic plate; a connection chip connecting a four corners of the outer frame part and a metallic chip being a part of the metallic plate; an external connection terminal formed on the second surface of the metallic plate; a plurality of concaved parts formed on the second surface of the metallic plate; and a resin layer filled into the plurality of concaved parts. The semiconductor device further includes a semiconductor element mounted on the semiconductor element mounting part of the semiconductor element substrate, the semiconductor element being electrically connected to the semiconductor element substrate.

According to the present invention, an external connection terminal may be placed in an array form on the entire surface of the back surface of the semiconductor element substrate. The external connection terminal is used to make a connection with the print wiring substrate. In this way, it is possible to response to an increase in the number of terminals of the semiconductor element.

Further, according to the present invention, a substrate is configured such that a lead frame is a base. Thus, a plated wiring is not used. As a result, it is possible to attain a reliability with respect to a thermal stress. Furthermore, according to the present invention, when the primary substrate is manufactured, defects such as the folding and bending of the wiring do not occur. At the time of a wire bonding, which is an assembling step of the semiconductor package, a slit is provided. Therefore, after the premolding resin is filled in the concaved part, the stress of the premolding resin generated at the time of hardening is reduced. In this way, it is possible to prevent the premolding resin from being peeled off from the metallic plate.

Hence, according to the present invention, it is possible to respond to an increase in the number of electrodes of the semiconductor element, attain a high degree of reliability, and perform a manufacturing and an assembling of the semiconductor package in a stable manner.

BRIEF DESCRIPTION OF THE DRAWINGS

The above objects and features of the present invention will be more apparent from the following description of some preferred embodiments with reference to the accompanying drawings, wherein.

DESCRIPTION OF EMBODIMENTS

Hereinafter, an embodiment of the present invention is described in detail with reference to the diagrams.

First Embodiment

FIGS. 1 to 6 are schematic cross sectional diagrams describing a step of a method of manufacturing a semiconductor element substrate according to a first embodiment of the present invention.

Figure 1:
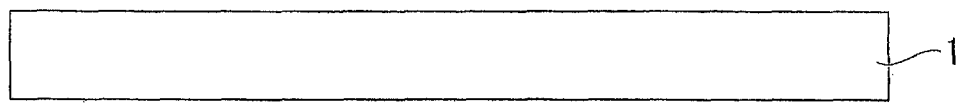
FIG. 1 is a schematic cross sectional diagram describing a step of a method of manufacturing a semiconductor element substrate according to a first embodiment of the present invention.
Figure 2:
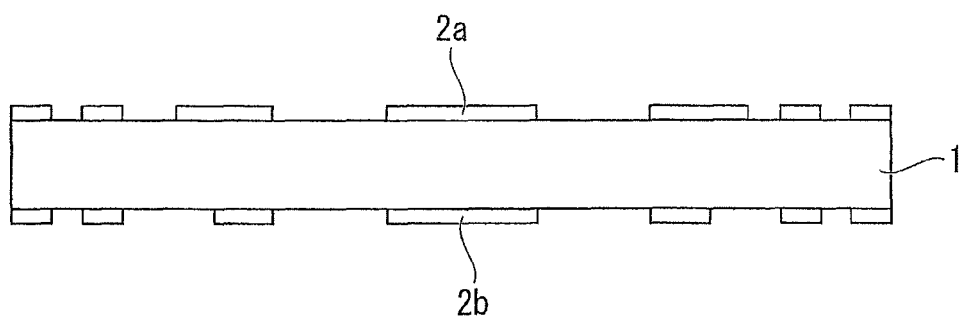
FIG. 2 is a schematic cross sectional diagram describing a step of a method of manufacturing a semiconductor element substrate according to a first embodiment of the present invention.
Figure 3:
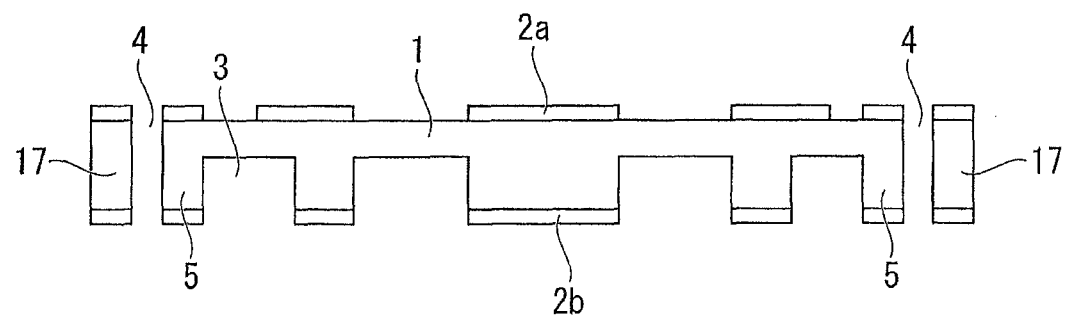
FIG. 3 is a schematic cross sectional diagram describing a step of a method of manufacturing a semiconductor element substrate according to a first embodiment of the present invention.
Figure 4:
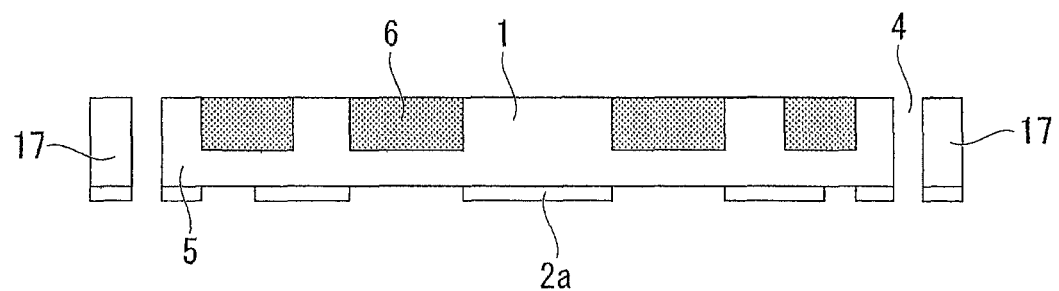
FIG. 4 is a schematic cross sectional diagram describing a step of a method of manufacturing a semiconductor element substrate according to a first embodiment of the present invention.
Figure 5:
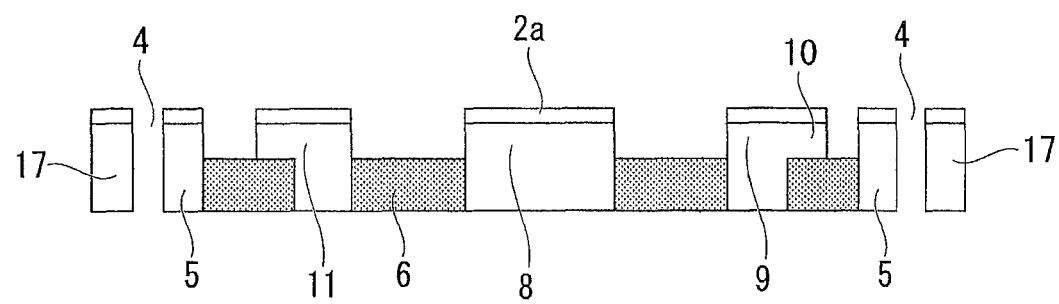
FIG. 5 is a schematic cross sectional diagram describing a step of a method of manufacturing a semiconductor element substrate according to a first embodiment of the present invention.

As shown in FIG. 1 and FIG. 2, a first photoresist pattern 2a of a photoresist is formed on an upper surface of the metallic plate 1 used for a lead frame. A second photoresist pattern 2b of a photoresist is formed on a lower surface of the metallic plate 1. The first photoresist pattern 2a on the upper surface of the metallic plate 1 is used to form, on an upper surface of the metallic plate 1, a semiconductor element mounting part 8, a semiconductor element electrode connection terminal 9, a wiring 10, an outer frame part 5, and a slit 4 (see FIG. 6). The slit 4 penetrates to the lower surface of the metallic plate 1. However, the peripheral of the outer frame part 5 and a metallic chip 17 are connected in at least the four corners of the outer frame part 5.

Figure 6:
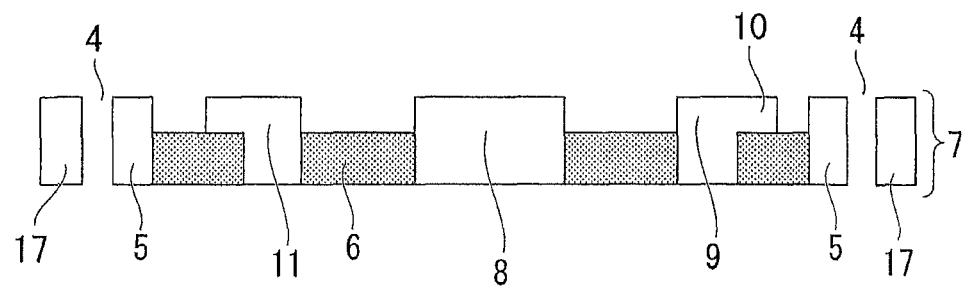
FIG. 6 is a schematic cross sectional diagram describing a step of a method of manufacturing a semiconductor element substrate according to a first embodiment of the present invention.

The second photoresist pattern 2b at the lower surface of the metallic plate 1 is for forming an external connection terminal 11, outer frame part 5, and a slit 4 at the lower surface of the metallic plate 1 (see FIG. 6). The slit 4 penetrates to the upper surface of the metallic plate 1. However, the peripheral of the outer frame part 5 and the metallic chip 17 are connected in at least the four corners of the outer frame part 5.

As the metallic plate 1, any material may be suitable as long as the material has an etching processability as a lead frame, mechanical strength, heat conductivity, expansion coefficient, and the like. However, an iron-nickel type alloy represented by a 42 alloy is often used. Alternately, a copper type alloy and the like added with various metallic elements in order to enhance the mechanical strength is also often used.

Next, an etching is performed from a lower surface of the metallic plate 1 using an etching liquid which dissolves the metallic plate 1. An example of the etching liquid is a ferric chloride solution. In this way, a concaved part 3 is formed (see FIG. 3). It is preferred that the depth of the concaved part 3 is such that a thickness of approximately 10 μm to 50 μm is maintained so that a fine wiring may be formed at the time of the next etching of the upper surface side. This is because a remaining part of the metallic plate 1 finally becomes a wiring.

Next, a covering is made with a cover film so that the concaved part 3 is not penetrated. Then, an etching is performed from an upper surface side. As a result, the slit 4 is formed on the outer frame part 5 (see FIG. 3). Since this slit 4 is formed on the outer frame part 5, a connection chip 18 is formed on the outer frame part 5 (see FIG. 7 and FIG. 8). The connection chip 18 connects at least the four corners of the outer frame part 5 and the metallic chip 17 of the outer frame part 5.

Next, the upper and lower surfaces of the metallic plate 1 processed with an etching operation are reversed. A resin layer 6 is injected to the upper surface of the metallic plate 1 so that the resin layer 6 does not enter the slit 4 (see FIG. 4). The resin layer 6 includes a liquid premolding resin.

The slit 4 is provided in the peripheral of the outer frame part 5. As a result, it is possible to reduce the stress generated when the resin layer 6 filled in the concaved part 3 is hardened. The resin layer 6 includes a premolding resin. Further, it is possible to prevent the resin layer 6 from peeling off from the metallic plate 1.

Furthermore, after the upper and lower surfaces of the metallic plate 1 are reversed and brought back to normal, the upper surface of the metallic plate 1 is etched. In this way, a semiconductor mounting part 8, a semiconductor element electrode connection terminal 9, and a wiring 10 are formed, and thereby, a semiconductor element substrate 7 is formed (see FIG. 5 and FIG. 6).

Figure 7:
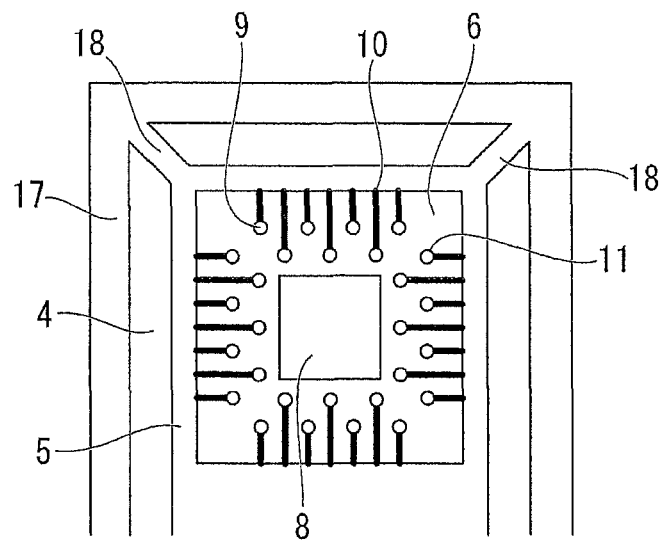
FIG. 7 is a partially cut out planar diagram showing a portion of a semiconductor element substrate according to a first embodiment of the present invention.
Figure 8:
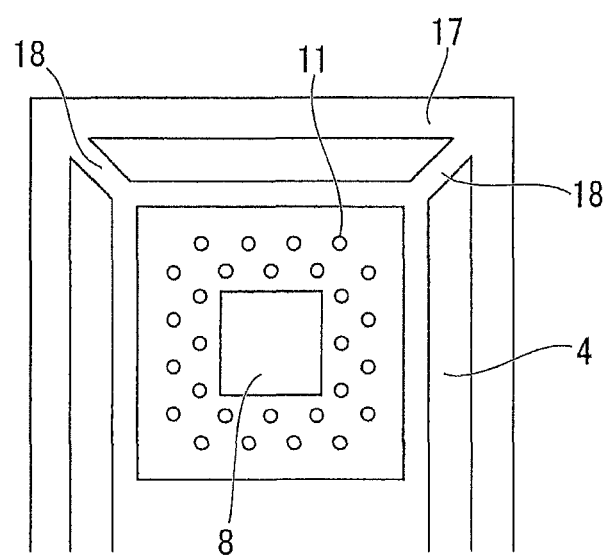
FIG. 8 is a partially cut out planar diagram showing another portion of a semiconductor element substrate according to a first embodiment of the present invention.

FIG. 7 is a partially cut out planar diagram showing a part of a semiconductor element substrate according to a first embodiment of the present invention. FIG. 8 is a partially cut out planar diagram showing another part of the semiconductor element substrate according to the first embodiment of the present invention. As shown in FIG. 7 and FIG. 8, the external connection terminal 11 is positioned in an array form. As a result, it is possible to respond to the increase in the pin of the semiconductor element. Further, since the slit 4 is formed, a condition is formed so that at least the four corners of the outer frame part 5 are connected with the metallic chip 17 by the connection chip 18.

Second Embodiment

Figure 9:
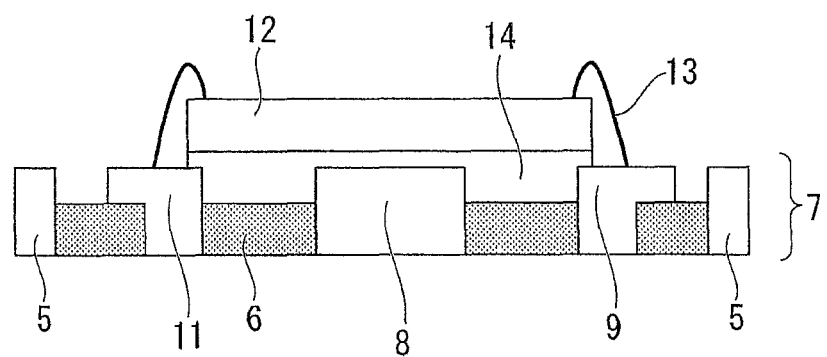
FIG. 9 is a simplified cross sectional diagram describing a step of a method of manufacturing a semiconductor device according to a second embodiment of the present invention.
Figure 10:
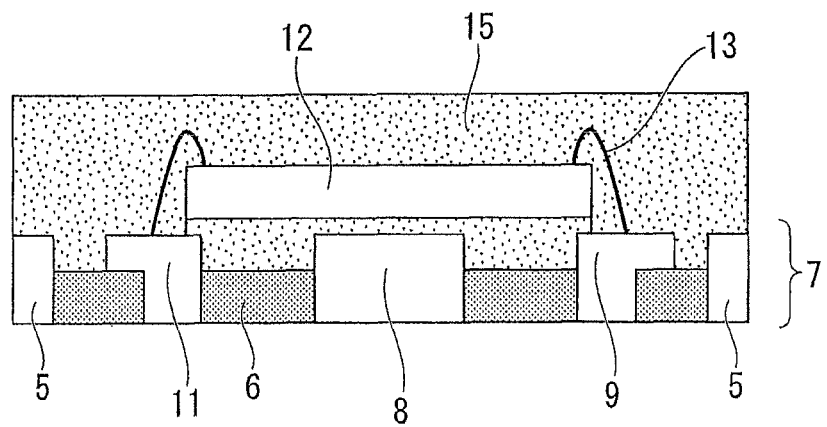
FIG. 10 is a simplified cross sectional diagram describing another step of a method of manufacturing a semiconductor device according to a second embodiment of the present invention.
Figure 11:
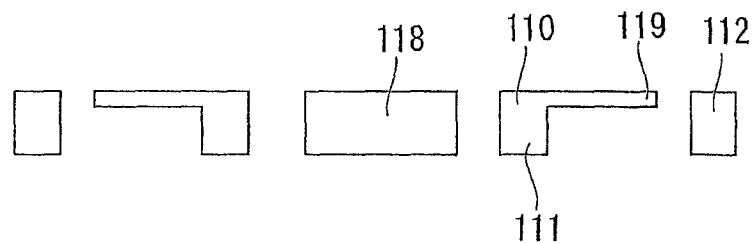
FIG. 11 is a simplified cross sectional diagram describing a step of a method of manufacturing a conventional semiconductor element substrate.
Figure 12:
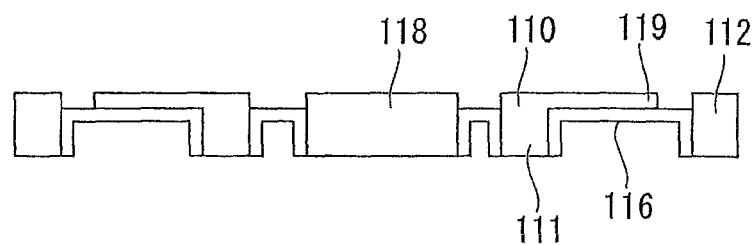
FIG. 12 is a simplified cross sectional diagram describing a step of a method of manufacturing a conventional semiconductor element substrate.

Next, a second embodiment of the present invention is described with respect to the diagrams. FIG. 9 is a simplified cross sectional diagram describing a step of a method of manufacturing a semiconductor device according to a second embodiment of the present invention. FIG. 10 is a simplified cross sectional diagram describing another step of a method of manufacturing a semiconductor device according to a second embodiment of the present invention. In the second embodiment, the components that are the same as the components in the first embodiment are referred to using the same reference number. The explanations of such components are omitted.

As shown in FIG. 9, a semiconductor element 12 is mounted on the semiconductor element mounting part 8 of the semiconductor element substrate 7 using a die attach material 14. The semiconductor element 12 is connected to the semiconductor element electrode connection terminal 9 with a gold wire 13. If necessary, the semiconductor element electrode connection terminal 9 is processed with a nickel-gold plating, a tin plating, a silver plating, or a nickel-palladium-gold plating. When a wire bonding is performed, the present semiconductor element substrate 7 in the form of a lead frame is mounted on a heat block. A welding is performed while heating. However, since the resin layer 6 exists throughout the bottom portion of the semiconductor element electrode connection terminal 9, and a void structure is not applied, it is possible to perform an assembling without triggering a connection defect.

Finally, as shown in FIG. 10, a side of the semiconductor element substrate 7 is sealed by a transfer mold or a potting.

The outer frame part 5 is detached with a diamond blade and the like. Thus, a transformation to small chips is made. In the case of a BGA type, a solder ball is mounted on the external connection terminal 11. Thus, a semiconductor device (semiconductor package) using the semiconductor element substrate 7 is obtained.

Working Example 1

Next, a first working example of the present invention is described in detail with reference to the diagrams. This Working Example 1 of the present invention relates to an example in which an LGA (Land Grid Array) type semiconductor element substrate is manufactured.

The size of the manufactured package of LGA is 10 mm square. At a lower surface of the package, an external connection terminal 11 is provided. The external connection terminal 11 is in an array form with 168 pins.

First, as shown in FIG. 1, a metallic plate 1 (EFTEC64T manufactured by Furukawa Electric Co., Ltd.) is prepared. This metallic plate 1 is made of copper alloy, and is shaped like a long band. The width of the metallic plate 1 is 150 mm. The thickness of the metallic plate 1 is 200 µm. Next, as shown in FIG. 2, on both surfaces of this metallic plate 1, a photoresist (OFPR4000, manufactured by Tokyo Ohka Kogyo Co., Ltd.) is coated with a roll coater so that the thickness of the photoresist becomes 5 µm. Then, a pre-baking is performed at 90° C.

Next, a pattern exposure is performed from both surfaces via a photo mask having a desired pattern. Then, a development processing is performed with a 1% sodium carbonate aqueous solution. Then, a washing is performed with water. In addition, a post-baking is performed. In this way, a first photoresist pattern 1a and a second photoresist pattern 2b were obtained as shown in FIG. 2.

The first photoresist pattern 2a on the upper surface (first surface) of the metallic plate 1 is used to form a semiconductor element mounting part 8, a connection terminal 9 with the semiconductor element electrode, a wiring 10, an outer frame part 5, and a slit 4 (see FIG. 6). The slit 4 penetrates to the second surface of the metallic plate 1. However, the peripheral of the outer frame part 5 and a metallic chip 17 are connected in at least the four corners of the outer frame part 5.

The second photoresist pattern 2b at the lower surface (second surface) of the metallic plate 1 is for forming an external connection terminal 11, outer frame part 5, and a slit 4 at the second surface of the metallic plate 1 (see FIG. 6). The slit 4 penetrates to the first surface of the metallic plate 1. However, the peripheral of the outer frame part 5 and the metallic chip 17 are connected in at least the four corners of the outer frame part 5.

Next, a front surface side of the metallic plate 1 is protected by covering the front surface side with a back sheet (not diagrammed). A first etching operation is performed from a second surface of the metallic plate using a ferric chloride solution. A portion of the metallic plate 1 exposed from the photoresist pattern 2b at a second surface side is thinned to a thickness of 30 µm. In this way, a concaved part 3 is formed (see FIG. 3). The specific weight of the ferric chloride solution is set to 1.38 at a liquid temperature of 50° C.

Next, a protection is made with a cover film so that the concaved part 3 is not penetrated (not diagrammed). A second etching operation is performed using a ferric chloride solution. Thus, a slit 4 is formed. The slit 4 penetrates through the first surface (see FIG. 3). The specific weight of the ferric chloride solution is set to 1.38 at a liquid temperature of 50° C.

Next, a metallic plate 1, the second surface of which is processed with an etching operation, is immersed in an ammonium persulfate solution of 50 g/L at a temperature of 30° C. for five minutes. As a result, the front surface of the etching surface formed by the first and second etching operations were made coarse (not diagrammed). Further, the metallic plate 1 is immersed in a predetermined aqueous sodium hydroxide type peeling liquid. Thus, the photoresist of the second surface is peeled off (not diagrammed).

Next, a liquid thermoplastic resin (SMC-376KF1, manufactured by Shin-Etsu Chemical Co., Ltd.) is injected to the second surface of the metallic plate 1 formed by the first and second etching operations, so that the liquid thermoplastic resin does not enter the portion of the slit 4. A primary hardening is performed at a temperature of 180° C. for only three hours. In this way, the resin layer 6 is formed (see FIG. 4).

The embedding capacity of the resin layer 6, which is a thermoplastic resin, is favorable. A defect such as a void was not observed. On a surface of the external connection terminal 11 and the outer frame part 5 that was not etched, the resin layer 6, which is a thermoplastic resin, did not remain. However, as a cleaning of the front surface as well, an immersion processing is performed in an alkaline solution of potassium permanganate (40 g/L potassium permanganate+20 g/L sodium hydroxide) at a temperature of 60° C. for three minutes.

Next, the back sheet at a first surface side of the metallic plate 1 is removed. A third etching operation is performed from the first surface side of the metallic plate 1 using a ferric chloride solution. A portion of the metallic plate 1 exposed from the photoresist pattern 2a is dissolved and removed. In this way, the semiconductor element mounting part 8, the semiconductor element electrode connection terminal 9, and the wiring 10 are formed (see FIG. 5). The external connection terminal 11 is extending from the semiconductor element electrode connection terminal 9. Although not diagrammed, at the time of the third etching operation, it is preferable that a back sheet and the like is attached to the second surface side of the metallic plate 1 so that an unnecessary etching operation is not performed at a second surface side of the metallic plate 1.

Next, a photoresist pattern 2a is peeled off from the first surface of the metallic plate 1. In this way, the semiconductor element substrate 7 is obtained (see FIG. 6). The semiconductor element substrate 7 is a desired lead frame type LGA substrate.

Next, after the photoresist pattern 2a, 2b were peeled off, an electrolytic nickel-gold plating is applied to an exposed surface of the metallic plate 1. The thickness of the nickel is 5 µm, while the thickness of the gold is 0.1 µm (not diagrammed).

Next, the semiconductor element 12 is mounted on the semiconductor element substrate 7, which is a lead frame type LGA substrate, using the die attach material 14. The die attach material 14 is hardened at a temperature of 150° C. for only one hour. Further, using a gold wire with a radius of 30 µm, an electrode of the semiconductor element 12 and the connection terminal 9 of the semiconductor element electrode is connected by wire bonding (see FIG. 9). The wire bonding is performed at a heating temperature of 200° C. When a pull strength of the wire at a connection terminal 9 side of the semiconductor element electrode is measured, a pull strength of greater than or equal to 9 g is obtained. In this way, a favorable connection is obtained.

Thereafter, as shown in FIG. 10, an area including the semiconductor element 12 and the connection terminal 9 of the semiconductor element electrode is sealed by a transfer molding resin 15. After cutting into small chips, a semiconductor device (semiconductor package) using the semiconductor element substrate 7 is obtained.

According to the present invention, it is possible to obtain a lead frame type substrate while reducing any defects during manufacturing, and while reducing any defects when a semiconductor package is assembled. Further, the reliability with respect to thermal stress may be enhanced. An aspect of the present invention is applied in particular to a package substrate having many pins, a response to which is difficult when a lead frame type semiconductor package is used.

A preferred embodiment of the present invention is described and exemplified above. However, these descriptions provide only an example of an aspect of the present invention. These descriptions are not to be considered to limit the present invention. Additions, deletions, replacements, and other alterations may be made as long as the additions, deletions, replacements, and other alterations do not deviate from the scope of the present invention. In other words, the present invention is not limited by the embodiments and working examples described above. The present invention is limited by the scope of the claims.

According to the present invention, it is possible to place an external connection terminal to the entire back surface of the semiconductor element substrate in an array form. The external connection terminal is used to make a connection with the print wiring substrate. In this way, a response may be made to an increase in the terminals of the semiconductor element.

Furthermore, according to the present invention, a substrate is based on a lead frame. Thus, a plating wiring is not used. As a result, it is possible to obtain reliability with respect to thermal stress. Moreover, according to the present invention, when the primary substrate is manufactured, defects such as a folding and bending of the wiring do not occur. In addition, a slit is provided. Therefore, at the time of a wire bonding, which is a step for assembling the semiconductor package, after a premolding resin is filled into a concaved part, there is a reduction in the stress of the premolding resin, generated when a hardening occurs. As a result, it is possible to prevent the premold resin from being peeled off from the metallic plate.

Therefore, according to the present invention, it is possible to respond to an increase in the number of electrodes of the semiconductor element. In addition, the reliability may be enhanced. Further, the manufacturing and assembling of the semiconductor package may be performed in a stable manner.

What is claimed is:

1. A manufacturing method of a semiconductor element substrate, the manufacturing method comprising:
    forming a first photoresist pattern on a first surface of a metallic plate, to form a slit penetrating the first surface of the metallic plate and a second surface different from the first surface, to connect a semiconductor element mounting part, a semiconductor element electrode connection terminal, a wiring, an outer frame part, a four corners of the outer frame part, and a metallic chip being a part of the metallic plate;
    forming a second photoresist pattern on the second surface of the metallic plate to form an external connection terminal, the outer frame part, and the slit;
    forming the slit by half etching to connect the metallic chip with the four corners of the outer frame part;
    forming a plurality of concaved parts on the second surface of the metallic plate;
    forming a resin layer by injecting a resin to the plurality of concaved parts so that the resin does not enter the slit and hardening the resin; and
    etching the first surface of the metallic plate and forming the semiconductor element electrode connection terminal and the outer frame, the semiconductor element electrode connection terminal and the outer frame being electrically connected to the semiconductor element mounting part and the external connection terminal.

* * * * *